(12) United States Patent
 Cheng

(10) Patent No.: US 10,601,419 B2
(45) Date of Patent: Mar. 24, 2020

(54) SWITCH CIRCUIT APPLIED TO A POWER DELIVERY INTEGRATED CIRCUIT

(71) Applicant: Etron Technology, Inc., Hsinchu (TW)

(72) Inventor: Wei-Chuan Cheng, Taipei (TW)

(73) Assignee: Etron Technology, Inc., Hsinchu (TW)

( * ) Notice: Subject to any disclaimer, the term of this patent is extended or adjusted under 35 U.S.C. 154(b) by 5 days.

(21) Appl. No.: 16/198,880

(22) Filed: Nov. 23, 2018

(65) Prior Publication Data

US 2019/0165780 A1    May 30, 2019

Related U.S. Application Data

(60) Provisional application No. 62/590,374, filed on Nov. 24, 2017.

(51) Int. Cl.
```
H03K 17/687    (2006.01)
G06F 1/26      (2006.01)
H03K 17/10     (2006.01)
H03K 17/693    (2006.01)
```

(52) U.S. Cl.
CPC ........ *H03K 17/6872* (2013.01); *G06F 1/266* (2013.01); *H03K 17/102* (2013.01); *H03K 17/693* (2013.01); *G06F 2213/0042* (2013.01); *H03K 2217/0009* (2013.01); *H03K 2217/0054* (2013.01)

(58) Field of Classification Search
CPC ........ G06F 1/00; G06F 1/266; G06F 2213/00; G06F 2213/0042; H03K 17/00; H03K 17/162; H03K 17/6872; H03K 17/693; H03K 19/00315; H01L 27/00; H01L 27/092
USPC ........................................................ 327/437
See application file for complete search history.

(56) References Cited

U.S. PATENT DOCUMENTS

| | | | |
|---|---|---|---|
| 8,497,727 B2 * | 7/2013 | Chiu ..................... | H03K 17/693 327/365 |
| 2017/0038810 A1 * | 2/2017 | Ueki ....................... | G06F 21/44 |
| 2018/0335819 A1 * | 11/2018 | Waters .................... | G06F 1/266 |

* cited by examiner

*Primary Examiner* — Lincoln D Donovan
*Assistant Examiner* — Dave Mattison
(74) *Attorney, Agent, or Firm* — Winston Hsu

(57) ABSTRACT

A power delivery integrated circuit is installed within a cable, and a switch circuit applied to the power delivery integrated circuit includes a first switch module, a second switch module, and a logic controller. When a first terminal of the cable receives a first voltage and a second terminal of the cable receives a second voltage, the logic controller optionally makes the first switch module transmit the first voltage to an identification circuit of the power delivery integrated circuit, or makes the second switch module transmit the second voltage to the identification circuit.

10 Claims, 5 Drawing Sheets

SWITCH CIRCUIT APPLIED TO A POWER DELIVERY INTEGRATED CIRCUIT

CROSS REFERENCE TO RELATED APPLICATIONS

This application claims the benefit of U.S. Provisional Application No. 62/590,374, filed on Nov. 24, 2017 and entitled "Novel Dual Input Power Switch Structure Suitable applied in Emarker IC," the contents of which are incorporated herein by reference.

BACKGROUND OF THE INVENTION

1. Field of the Invention

The present invention relates to a switch circuit applied to a power delivery integrated circuit, and particularly to a switch circuit that not only can prevent a host of different hosts coupled to the switch circuit from being damaged by another host of the different hosts, but also can provide a high enough supply voltage to an identification circuit of the power delivery integrated circuit.

2. Description of the Prior Art

In the prior art, when two terminals of a cable are electrically connected to different power sources, a power delivery integrated circuit installed in the cable utilizes two face-to-face connected diodes to prevent a power source of the different power sources from being damaged by another power source of the different power sources, wherein each diode of the diodes has about 0.7V voltage drop. In a power delivery version 3.0 specification, because the 0.7V voltage drop of the each diode sacrifices too much head-room, the power delivery integrated circuit will difficult provide a high enough supply voltage to an identification circuit of the power delivery integrated circuit through the diodes when supply voltages provided by the different power sources are reduced for meeting the power delivery version 3.0 specification, resulting in a low-dropout regulator (LDO) or a bandgap reference circuit of the identification circuit being difficult to design. Therefore, how to design a power delivery integrated circuit which can meet the power delivery version 3.0 specification becomes an import issue.

SUMMARY OF THE INVENTION

An embodiment of the present invention provides a switch circuit applied to a power delivery integrated circuit, wherein the power delivery integrated circuit is installed within a cable. The switch circuit includes a first switch module, a second switch module, and a logic controller. When a first terminal of the cable receives a first voltage and a second terminal of the cable receives a second voltage, the logic controller optionally makes the first switch module transmit the first voltage to an identification circuit of the power delivery integrated circuit, or makes the second switch module transmit the second voltage to the identification circuit.

Another embodiment of the present invention provides a switch circuit applied to a power delivery integrated circuit, wherein the power delivery integrated circuit is installed within a cable. The switch circuit includes a first switch module, a second switch module, and a logic controller. When a first terminal of the cable receives a first voltage, a second terminal of the cable receives a second voltage, the first switch module is turned off, and the second switch module is turned on, the first switch module isolates the second voltage from being transmitted to the first terminal of the cable and the second switch module transmits the second voltage to an identification circuit of the power delivery integrated circuit.

The present invention provides a switch circuit applied to a power delivery integrated circuit. When a first terminal of a cable receives a first voltage and a second terminal of the cable receives a second voltage, the switch circuit can utilize a logic controller to optionally make a first switch module transmit the first voltage to an identification circuit of the power delivery integrated circuit, or make a second switch module transmit the second voltage to the identification circuit. On the other hand, when the first terminal of the cable receives the first voltage, the second terminal of the cable receives the second voltage, the first switch module is turned off, and the second switch module is turned on, the first switch module can prevent the second voltage being transmitted to the first terminal of the cable, and the second switch module transmits the second voltage to the identification circuit. Therefore, compared to the prior art, the present invention can prevent a host of different hosts coupled to the switch circuit from being damaged by another host of the different hosts, can utilize the logic controller to optionally make a host of the different hosts provide a supply voltage to the identification circuit and prevent a supply voltage provided by another host of the different hosts from being transmitted to the identification circuit, and can provide a high enough supply voltage to the identification circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
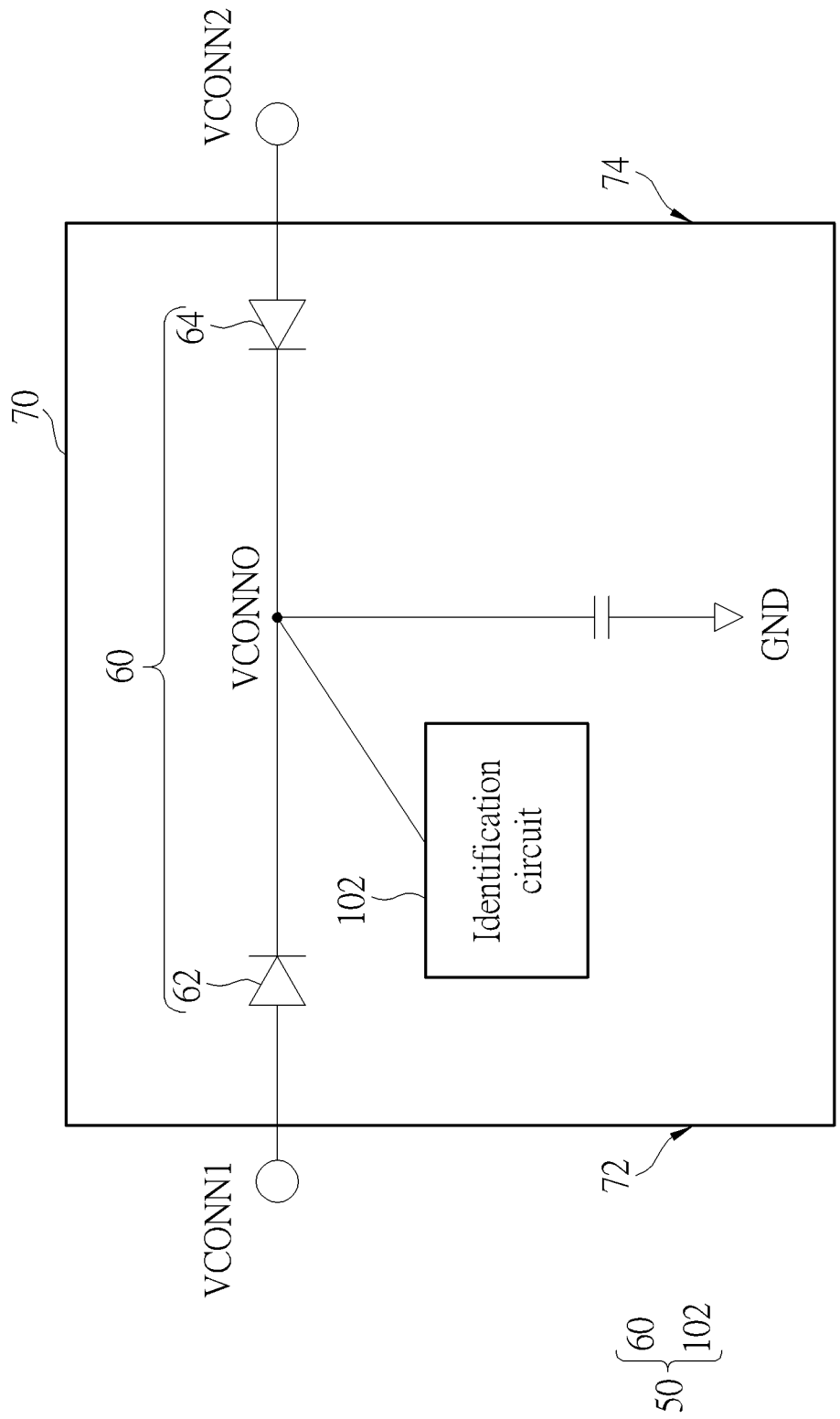
FIG. 1 is a transmission circuit applied to a power delivery integrated circuit according to the prior art.

Please refer to FIG. 1. FIG. 1 is a transmission circuit 60 applied to a power delivery integrated circuit 50 according to the prior art, wherein the transmission circuit 60 includes a first diode 62 and a second diode 64, the power delivery integrated circuit 50 includes the transmission circuit 60 and an identification circuit 102, and the power delivery integrated circuit 50 is installed within a cable 70. As shown in FIG. 1, when a first terminal 72 of the cable 70 is electrically connected to a first host (not shown in FIG. 1), a first voltage VCONN1 provided by the first host can pass the first diode 62, but cannot pass the second diode 64, so a voltage (VCONN1—0.7V) of a node VCONN0 can be delivered to the identification circuit 102; when a second terminal 74 of the cable 70 is electrically connected to a second host (not shown in FIG. 1), a second voltage VCONN2 provided by the second host can pass the second diode 64, but cannot pass the first diode 62, so the voltage (VCONN1—0.7V) of the node VCONN0 can be delivered to the identification circuit 102. Although the transmission circuit 60 can utilize the second diode 64 to prevent (isolate) the first voltage VCONN1 from being delivered to the second terminal 74 of the cable 70, and utilize the first diode 62 to prevent (isolate) the second voltage VCONN2 from being delivered to the first terminal 72 of the cable 70, a voltage drop (0.7V) on each diode of the first diode 62 and the second diode 64 will sacrifice too much head-room. Therefore, for meeting a specification of power delivery 3.0 version to reduce the first voltage VCONN1 provided by the first host and the second voltage VCONN2 provided by the second host, it is difficult for the power delivery integrated circuit 50 to provide a sufficiently high supply voltage to the identification circuit 102 of the power delivery integrated circuit 50 through the transmission circuit 60.

Figure 2A:
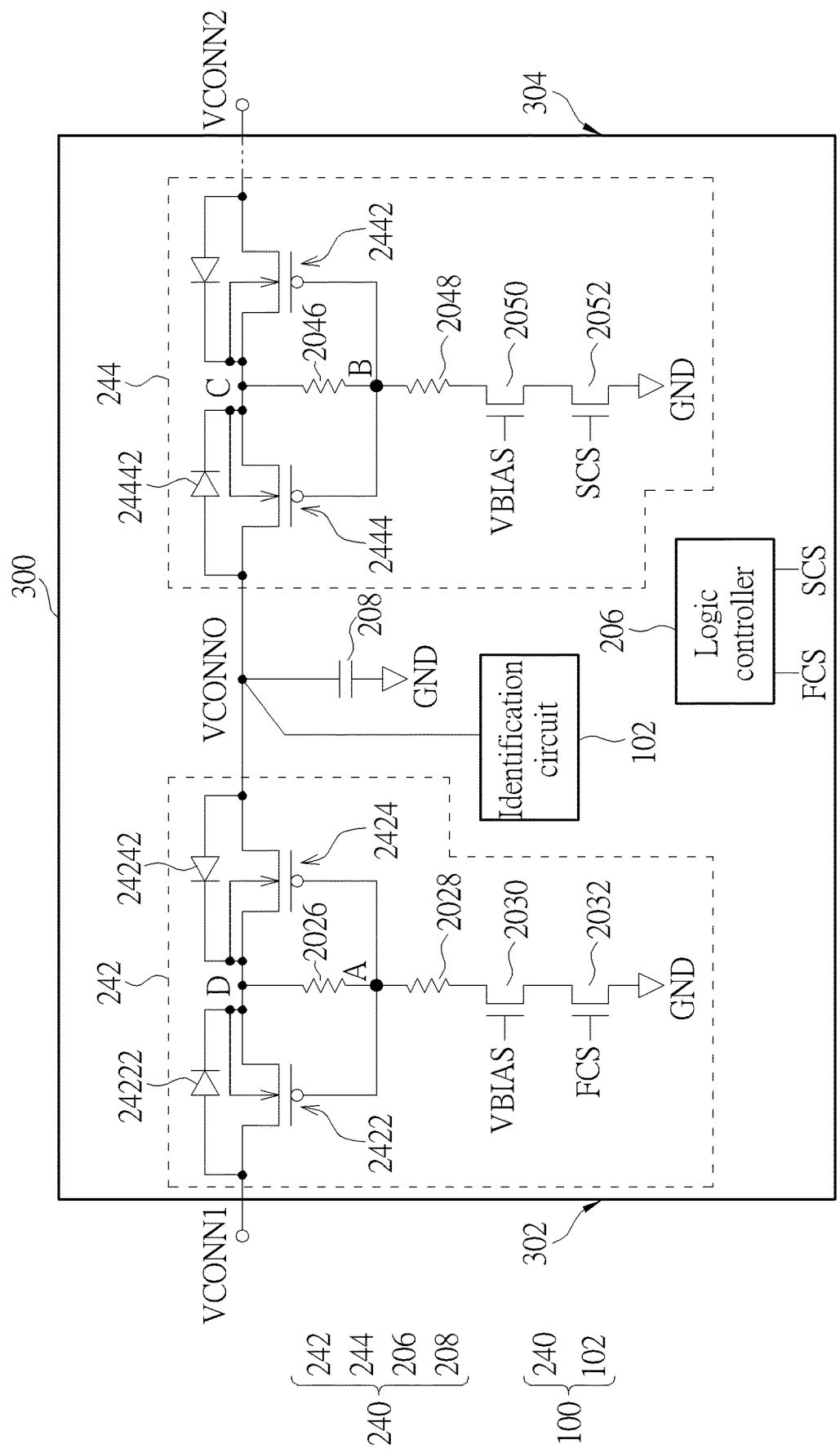
FIG. 2A is a diagram illustrating a switch circuit applied to a power delivery integrated circuit according to a first embodiment of the present invention.

Please refer to FIG. 2A. FIG. 2A is a diagram illustrating a switch circuit 240 applied to a power delivery integrated circuit 100 according to a first embodiment of the present invention, wherein the power delivery integrated circuit 100 is installed in a first terminal 302 of a cable 300, and the cable 300 is a universal serial bus cable (type C). But, the present invention is not limited to the power delivery integrated circuit 100 being installed in the first terminal 302 of the cable 300. That is, the power delivery integrated circuit 100 can also be installed in a second terminal 304 of the cable 300. In addition, in another embodiment of the present invention, the power delivery integrated circuit 100 is installed in each of the first terminal 302 and the second terminal 304 of the cable 300. As shown in FIG. 2A, the switch circuit 240 includes a first switch module 242, a second switch module 244, a logic controller 206, and a capacitor 208.

As shown in FIG. 2A, the first switch module 242 includes a first P-type metal-oxide-semiconductor transistor 2422, a second P-type metal-oxide-semiconductor transistor 2424, a first resistor 2026, a second resistor 2028, a first N-type metal-oxide-semiconductor transistor 2030, and a second N-type metal-oxide-semiconductor transistor 2032. A first terminal of the first P-type metal-oxide-semiconductor transistor 2422 is coupled to the first terminal 302 of the cable 300; a first terminal of the second P-type metal-oxide-semiconductor transistor 2424 is coupled to a second terminal of the first P-type metal-oxide-semiconductor transistor 2422, and a second terminal of the second P-type metal-oxide-semiconductor transistor 2424 is coupled to the identification circuit 102 and the capacitor 208 of the power delivery integrated circuit 100; a first terminal of the first resistor 2026 is coupled to the second terminal of the first P-type metal-oxide-semiconductor transistor 2422 and the first terminal of the second P-type metal-oxide-semiconductor transistor 2424; a first terminal of the second resistor 2028 is coupled to a second terminal of the first resistor 2026; a first terminal of the first N-type metal-oxide-semiconductor transistor 2030 is coupled to a second terminal of the second resistor 2028, and a second terminal of the first N-type metal-oxide-semiconductor transistor 2030 receives a bias VBIAS; and a first terminal of the second N-type metal-oxide-semiconductor transistor 2032 is coupled to a third terminal of the first N-type metal-oxide-semiconductor transistor 2030, a second terminal of the second N-type metal-oxide-semiconductor transistor 2032 receives a first control signal FCS generated by the logic controller, and a third terminal of the second N-type metal-oxide-semiconductor transistor 2032 is coupled to ground GND. In addition, in one embodiment of the present invention, the first P-type metal-oxide-semiconductor transistor 2422 and the second P-type metal-oxide-semiconductor transistor 2424 can be replaced with transmission gates, and a control terminal of the first P-type metal-oxide-semiconductor transistor 2422 and a control terminal of the second P-type metal-oxide-semiconductor transistor 2424 are coupled to a node A (that is, the second terminal of the first resistor 2026) shown in FIG. 2A.

In addition, as shown in FIG. 2A, the second switch module 244 includes a third P-type metal-oxide-semiconductor transistor 2442, a fourth P-type metal-oxide-semiconductor transistor 2444, a third resistor 2046, a fourth resistor 2048, a third N-type metal-oxide-semiconductor transistor 2050, and a fourth N-type metal-oxide-semiconductor transistor 2052. A first terminal of the third P-type metal-oxide-semiconductor transistor 2442 is coupled to the second terminal 304 of the cable 300; a first terminal of the fourth P-type metal-oxide-semiconductor transistor 2444 is coupled to a second terminal of the third P-type metal-oxide-semiconductor transistor 2442, and a second terminal of the fourth P-type metal-oxide-semiconductor transistor 2444 is coupled to the identification circuit 102 and the capacitor 208; a first terminal of the third resistor 2046 is coupled to a second terminal of the third P-type metal-oxide-semiconductor transistor 2442 and the first terminal of the fourth P-type metal-oxide-semiconductor transistor 2444; a first terminal of the fourth resistor 2048 is coupled to a second terminal of the third resistor 2046; a first terminal of the third N-type metal-oxide-semiconductor transistor 2050 is coupled to a second terminal of the fourth resistor 2048, and a second terminal of the third N-type metal-oxide-semiconductor transistor 2050 receives the bias VBIAS; and a first terminal of the fourth N-type metal-oxide-semiconductor transistor 2052 is coupled to a third terminal of the third N-type metal-oxide-semiconductor transistor 2050, a second terminal of the fourth N-type metal-oxide-semiconductor transistor 2052 receives a second control signal SCS generated by the logic controller, and a third terminal of the fourth N-type metal-oxide-semiconductor transistor 2052 is coupled to the ground GND. In addition, in one embodiment of the present invention, the third P-type metal-oxide-semiconductor transistor 2442 and the fourth P-type metal-oxide-semiconductor transistor 2444 can be replaced with transmission gates, and a control terminal of the third P-type metal-oxide-semiconductor transistor 2442 and a control terminal of the fourth P-type metal-oxide-semiconductor transistor 2444 are coupled to a node B (that is, the second terminal of the third resistor 2046) shown in FIG. 2A. In addition, the bias VBIAS is used for turning on the first N-type metal-oxide-semiconductor transistor 2030 and the third N-type metal-oxide-semiconductor transistor 2050. For example, the bias VBIAS is between 2.7V and 3.3V. But, the present invention is not limited to the bias VBIAS being between 2.7V and 3.3V.

Figure 2B:
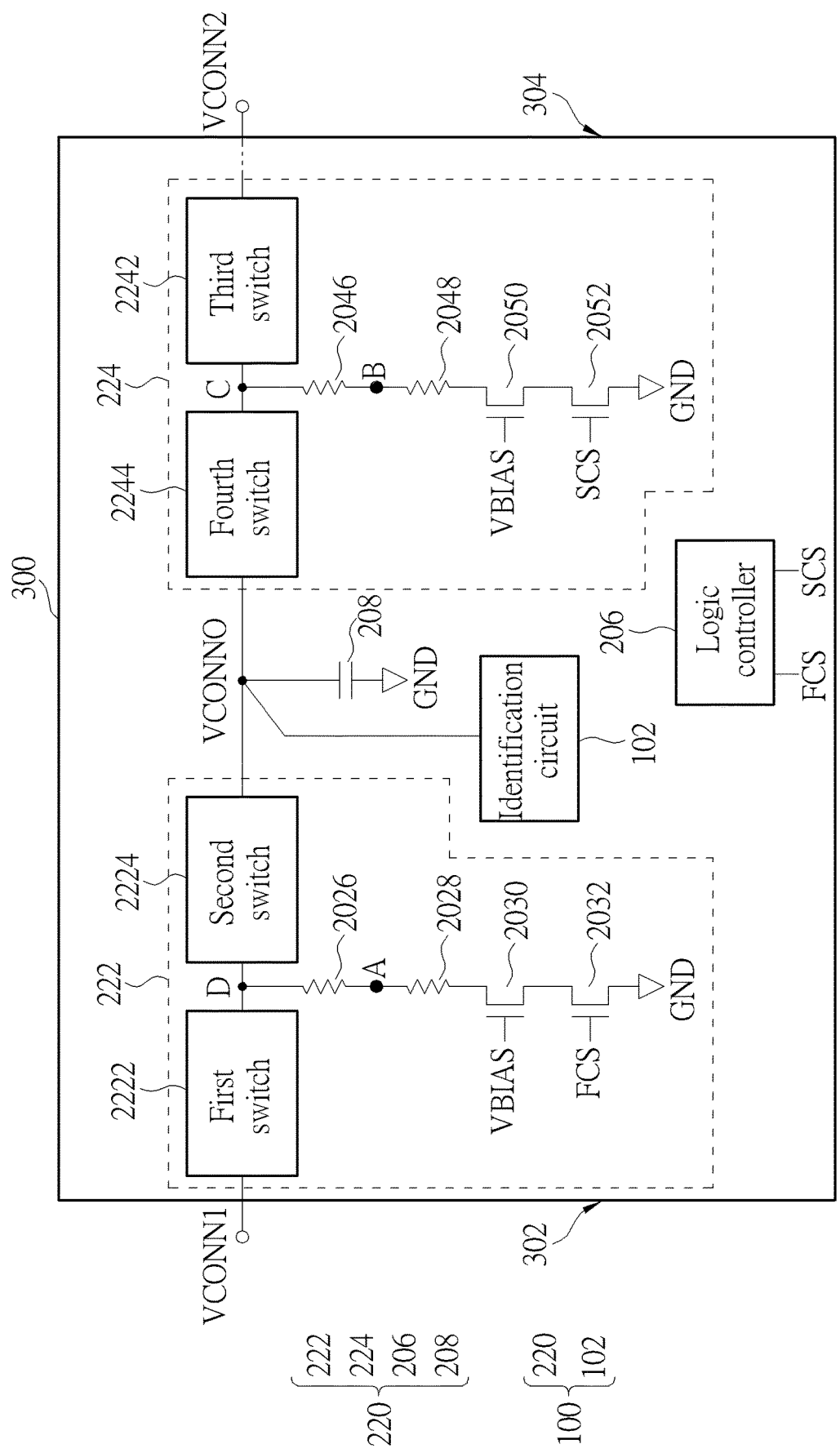
FIG. 2B is a diagram illustrating a switch circuit applied to a power delivery integrated circuit according to a second embodiment of the present invention.

In addition, please refer to FIG. 2B. FIG. 2B is a diagram illustrating a switch circuit 220 applied to the power delivery integrated circuit 100 according to a second embodiment of the present invention. As shown in FIG. 2B, differences between the switch circuit 220 and the switch circuit 240 are that a first switch module 222 of the switch circuit 220 utilizes a first switch 2222 and a second switch 2224 to substitute for the first P-type metal-oxide-semiconductor transistor 2422 and the second P-type metal-oxide-semiconductor transistor 2424 respectively, and a second switch module 224 of the switch circuit 220 utilizes a third switch 2242 and a fourth switch 2244 to substitute for the third P-type metal-oxide-semiconductor transistor 2442 and the fourth P-type metal-oxide-semiconductor transistor 2444 respectively, wherein the first switch 2222, the second switch 2224, the third switch 2242, and the fourth switch 2244 are N-type metal-oxide-semiconductor transistors. In addition, each switch of the first switch 2222, the second switch 2224, the third switch 2242, and the fourth switch 2244 can execute a function of a metal-oxide-semiconductor transistor of the switch circuit 240 corresponding to the each switch according to a corresponding control signal thereof (not shown in FIG. 2B). In addition, in another embodiment of the present invention, the first switch 2222, the second switch 2224, the third switch 2242, and the fourth switch 2244 are P-type metal-oxide-semiconductor transistors or transmission gates.

Figure 2C:
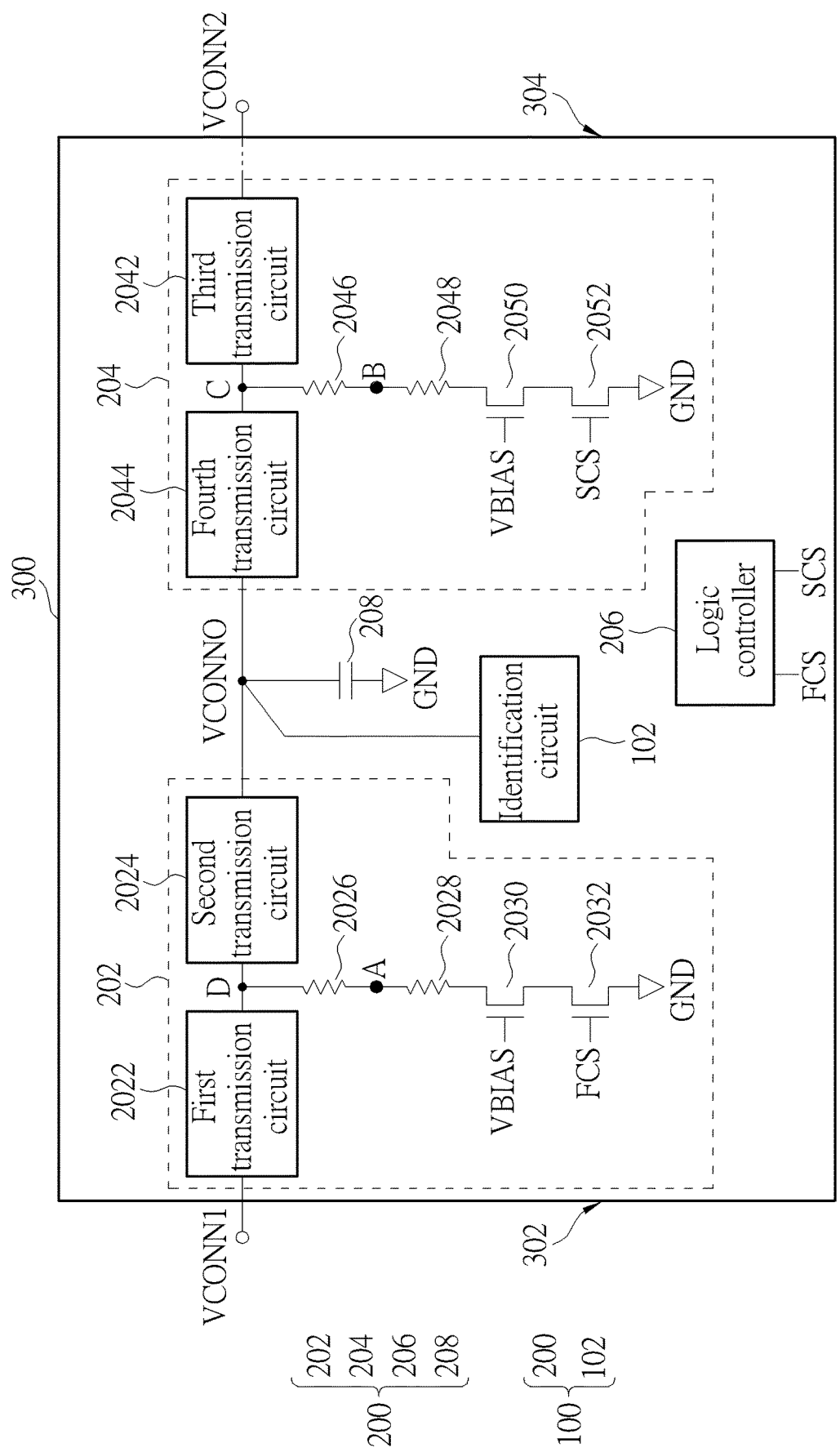
FIG. 2C is a diagram illustrating a switch circuit applied to a power delivery integrated circuit according to a third embodiment of the present invention.

In addition, please refer to FIG. 2C. FIG. 2C is a diagram illustrating a switch circuit 200 applied to the power delivery integrated circuit 100 according to a third embodiment of the present invention. As shown in FIG. 2C, differences between the switch circuit 200 and the switch circuit 240 are that a first switch module 202 of the switch circuit 200 utilizes a first transmission circuit 2022 and a second transmission circuit 2024 to substitute for the first P-type metal-oxide-semiconductor transistor 2422 and the second P-type metal-oxide-semiconductor transistor 2424 respectively, and a second switch module 204 of the switch circuit 200 utilizes a third transmission circuit 2042 and a fourth transmission circuit 2044 to substitute for the third P-type metal-oxide-semiconductor transistor 2442 and the fourth P-type metal-oxide-semiconductor transistor 2444 respectively, wherein the first transmission circuit 2022, the second transmission circuit 2024, the third transmission circuit 2042, and the fourth transmission circuit 2044 are N-type metal-oxide-semiconductor transistors. In addition, each switch of the first transmission circuit 2022, the second transmission circuit 2024, the third transmission circuit 2042, and the fourth transmission circuit 2044 can execute a function of a metal-oxide-semiconductor transistor of the switch circuit 240 corresponding to the each switch according to a corresponding control signal thereof (not shown in FIG. 2C). In addition, in another embodiment of the present invention, the first transmission circuit 2022, the second transmission circuit 2024, the third transmission circuit 2042, and the fourth transmission circuit 2044 are P-type metal-oxide-semiconductor transistors or transmission gates.

Figure 3:
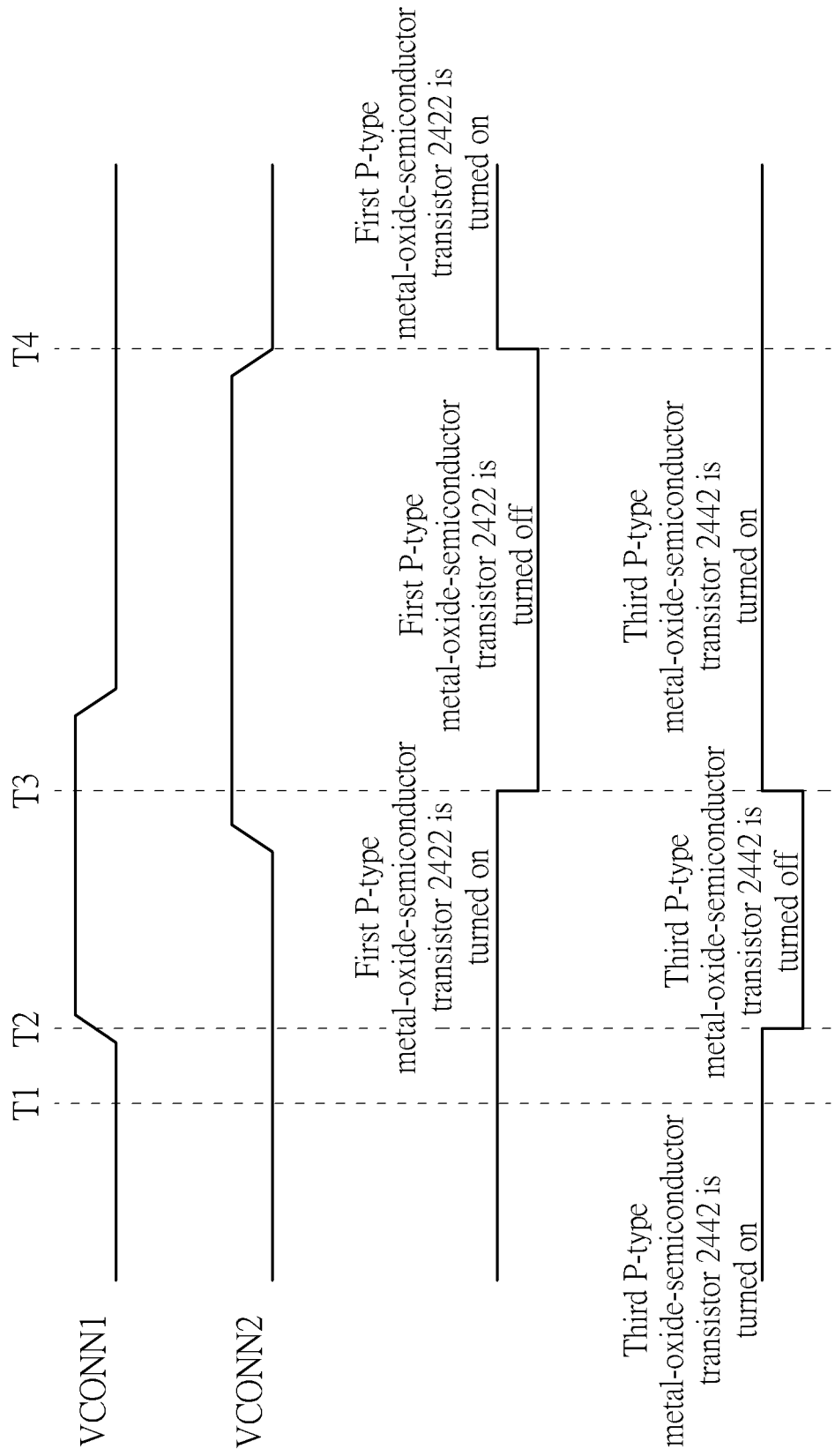
FIG. 3 is a diagram illustrating an operation timing of the switch circuit.

Please refer to FIG. 3. FIG. 3 is a diagram illustrating an operation timing of the switch circuit 240. In the embodiment shown in FIG. 3, the first voltage VCONN1 is provided by the first host, and the second voltage VCONN2 is provided by the second host. When the first voltage VCONN1 is high, the first terminal 302 of the cable 300 is electrically connected to the first host, and when the first voltage VCONN1 is low, the first terminal 302 of the cable 300 is not electrically connected to the first host. Similarly, when the second voltage VCONN2 is high, the second terminal 304 of the cable 300 is electrically connected to the second host, and when the second voltage VCONN2 is low, the second terminal 304 of the cable 300 is not electrically connected to the second host. In addition, to make FIGS. 2A-2C clearly describe the present invention, both the first host and the second host are neglected in FIGS. 2A-2C. As shown in FIG. 3, at a time T1, because the first terminal 302 and the second terminal 304 of the cable 300 are not electrically connected to the first host and the second host, the logic controller 206 enables the first control signal FCS and the second control signal SCS to turn the first P-type metal-oxide-semiconductor transistor 2422 and the third P-type metal-oxide-semiconductor transistor 2442 (that is, when the first terminal 302 and the second terminal 304 of the cable 300 are not electrically connected to the first host and the second host, default states of the first P-type metal-oxide-semiconductor transistor 2422 and the third P-type metal-oxide-semiconductor transistor 2442 are turning-on).

As shown in FIG. 3, at a time T2, because the first terminal 302 of the cable 300 is electrically connected to the first host and the second terminal 304 of the cable 300 is not electrically connected to the second host, the logic controller 206 continuously enables the first control signal FCS, and disables the second control signal SCS. Because the first control signal FCS is enabled, and the control terminal of the first P-type metal-oxide-semiconductor transistor 2422 and the control terminal of the second P-type metal-oxide-semiconductor transistor 2424 are coupled to the node A shown in FIG. 2A, the first P-type metal-oxide-semiconductor transistor 2422 and the second P-type metal-oxide-semiconductor transistor 2424 are turned on, resulting in the first voltage VCONN1 provided by the first host is delivered to the identification circuit 102 through the first P-type metal-oxide-semiconductor transistor 2422, the second P-type metal-oxide-semiconductor transistor 2424, and a node VCONN0, wherein after the identification circuit 102 is turned on according to the first voltage VCONN1, the identification circuit 102 can transmit at least one of a maximum support transmission current, a maximum support transmission voltage, a serial number, a manufacturer, and a length of the cable 300 to the first host, and meanwhile a voltage of the node VCONN0 is equal to the first voltage VCONN1. In addition, the first host can generate corresponding power transmission parameters according to at least one of the maximum support transmission current, the maximum support transmission voltage, the serial number, the manufacturer, and the length of the cable 300. For example, the first host can provide corresponding transmission voltage and transmission current according to at least one of the maximum support transmission current, the maximum support transmission voltage, the serial number, the manufacturer, and the length of the cable 300. In addition, because the voltage of the node VCONN0 is equal to the first voltage VCONN1, the first voltage VCONN1 can be transmitted to a node C through forward conduction of a parasitic diode 24442 of the fourth P-type metal-oxide-semiconductor transistor 2444, wherein a voltage drop of the parasitic diode 24442 is about 0.5V~0.7V. In addition, because the second control signal SCS is disabled, the fourth N-type metal-oxide-semiconductor transistor 2052 is turned off (meanwhile, no current flows through the third resistor 2046, the fourth resistor 2048, the third N-type metal-oxide-semiconductor transistor 2050, and the fourth N-type metal-oxide-semiconductor transistor 2052), resulting in a voltage of the node B is approximately equal to the first voltage VCONN1, further resulting in the third P-type metal-oxide-semiconductor transistor 2442 and the fourth P-type metal-oxide-semiconductor transistor 2444 being turned off (because the control terminal of the third P-type metal-oxide-semiconductor transistor 2442 and the control terminal of the fourth P-type metal-oxide-semiconductor transistor 2444 are coupled to the node B shown in FIG. 2A).

As shown in FIG. 3, at a time T3, because the first terminal 302 of the cable 300 is electrically connected to the first host (not shown in FIG. 2A) and the second terminal 304 of the cable 300 is electrically connected to the second host (not shown in FIG. 2A), in one embodiment of the present invention, the logic controller 206 can disable the first control signal FCS and enable the second control signal SCS again, wherein the first voltage VCONN1 is less than the second voltage VCONN2 (e.g. the first voltage VCONN1 is 2.7V and the second voltage VCONN2 is 5V). Because the second control signal SCS is enabled, and the control terminal of the third P-type metal-oxide-semiconductor transistor 2442 and the control terminal of the fourth P-type metal-oxide-semiconductor transistor 2444 are coupled to the node B shown in FIG. 2A, the third P-type metal-oxide-semiconductor transistor 2442 and the fourth P-type metal-oxide-semiconductor transistor 2444 are turned on, resulting in the second voltage VCONN2 provided by the second host being transmitted to the identification circuit 102 through the third P-type metal-oxide-semiconductor transistor 2442, the fourth P-type metal-oxide-semiconductor transistor 2444, and the node VCONN0, wherein after the identification circuit 102 is turned on according to the second voltage VCONN2, the identification circuit 102 transmit at least one of the maximum support transmission current, the maximum support transmission voltage, the serial number, the manufacturer, and the length of the cable 300 to the second host, and meanwhile the voltage of the node VCONN0 is equal to the second voltage VCONN2. In addition, the second host can generate corresponding power transmission parameters according to at least one of the maximum support transmission current, the maximum support transmission voltage, the serial number, the manufacturer, and the length of the cable 300. For example, the second host can provide corresponding transmission voltage and transmission current according to at least one of the maximum support transmission current, the maximum support transmission voltage, the serial number, the manufacturer, and the length of the cable 300. In addition, because the voltage of the node VCONN0 is equal to the second voltage VCONN2, the second voltage VCONN2 can be transmitted to a node D through forward conduction of a parasitic diode 24242 of the second P-type metal-oxide-semiconductor transistor 2424. In addition, because first control signal FCS is disabled, a voltage of the node A is approximately equal to the second voltage VCONN2, resulting in first P-type metal-oxide-semiconductor transistor 2422 and the second P-type metal-oxide-semiconductor transistor 2424 are turned off (because the control terminal of the first P-type metal-oxide-semiconductor transistor 2422 and the control terminal of the second P-type metal-oxide-semiconductor transistor 2424 are coupled to the node A shown in FIG. 2A). Because the voltage of the node VCONN0 (the second voltage VCONN2) can be transmitted to the first resistor 2026, the second resistor 2028, the first N-type metal-oxide-semiconductor transistor 2030, and the second N-type metal-oxide-semiconductor transistor 2032 through the parasitic diode 24242 of the second P-type metal-oxide-semiconductor transistor 2424, when the first control signal FCS is disabled, the voltage of the node A (the second voltage VCONN2) can effectively turn off the first P-type metal-oxide-semiconductor transistor 2422 and the second P-type metal-oxide-semiconductor transistor 2424. However, because a parasitic diode 24222 of the first P-type metal-oxide-semiconductor transistor 2422 is in a reverse bias state, the parasitic diode 24222 of the first P-type metal-oxide-semiconductor transistor 2422 cannot transmit the first voltage VCONN1 to the node D.

In addition, in another embodiment of the present invention, at the time T3, the logic controller 206 can continuously enable the first control signal FCS and continuously disable the second control signal SCS, meanwhile operation of the first P-type metal-oxide-semiconductor transistor 2422, the second P-type metal-oxide-semiconductor transistor 2424, the third P-type metal-oxide-semiconductor transistor 2442, and the fourth P-type metal-oxide-semiconductor transistor 2444 can be referred to the above mentioned descriptions, so further description thereof is omitted for simplicity.

In addition, in another embodiment of the present invention, at the time T3, the first terminal 302 of the cable 300 is electrically connected to the first host and the second terminal 304 of the cable 300 is electrically connected to the second host, the logic controller 206 disables the first control signal FCS and enables the second control signal SCS again, wherein the first voltage VCONN1 is greater than the second voltage VCONN2 (e.g. the first voltage VCONN1 is 5V and the second voltage VCONN2 is 2.7V). Because the second control signal SCS is enabled, and the control terminal of the third P-type metal-oxide-semiconductor transistor 2442 and the control terminal of the fourth P-type metal-oxide-semiconductor transistor 2444 are coupled to the node B shown in FIG. 2A, the third P-type metal-oxide-semiconductor transistor 2442 and the fourth P-type metal-oxide-semiconductor transistor 2444 are turned on, resulting in the second voltage VCONN2 provided by the second host being transmitted to the identification circuit 102 through the third P-type metal-oxide-semiconductor transistor 2442, the fourth P-type metal-oxide-semiconductor transistor 2444, and the node VCONN0. In addition, because the voltage of the node VCONN0 is equal to the second voltage VCONN2, and the second voltage VCONN2 (2.7V) is less than the first voltage VCONN1 (5V), the first voltage VCONN1 can be transmitted to the node D through forward conduction of the parasitic diode 24222 of the first P-type metal-oxide-semiconductor transistor 2422. In addition, because first control signal FCS is disabled, the voltage of the node A is approximately equal to the first voltage VCONN1, resulting in first P-type metal-oxide-semiconductor transistor 2422 and the second P-type metal-oxide-semiconductor transistor 2424 are turned off (because the control terminal of the first P-type metal-oxide-semiconductor transistor 2422 and the control terminal of the second P-type metal-oxide-semiconductor transistor 2424 are coupled to the node A shown in FIG. 2A).

As shown in FIG. 3, at a time T4, because the first terminal 302 and the second terminal 304 of the cable 300 are not electrically connected to the first host and the second host again, the logic controller 206 enables the first control signal FCS again and continuously enables the second control signal SCS. Because the first control signal FCS and the second control signal SCS are enabled, the first P-type metal-oxide-semiconductor transistor 2422 are turned on. In addition, because after the time T3, the second control signal SCS is continuously enabled, the third P-type metal-oxide-semiconductor transistor 2442 are continuously turned on after the time T3. That is, at the time T4, because the first terminal 302 and the second terminal 304 of the cable 300 are not electrically connected to the first host and the second host again, the first P-type metal-oxide-semiconductor transistor 2422 and the third P-type metal-oxide-semiconductor transistor 2442 are returned to the default state (that is, the first P-type metal-oxide-semiconductor transistor 2422 and the third P-type metal-oxide-semiconductor transistor 2442 are turned on).

Therefore, according to the above mentioned description of the operation timing of the switch circuit 240, it is obvious that when the first terminal 302 of the cable 300 is electrically connected to the first host and the second terminal 304 of the cable 300 is electrically connected to the second host, the switch circuit 240 can utilize a two-stage transmission cascade structure shown in the first switch module 242 and the second switch module 244 to effectively prevent the first voltage VCONN1 from transmitting to the second host through the cable 300 or prevent the second voltage VCONN2 from transmitting to the first host through the cable 300. That is to say, when the first terminal 302 of the cable 300 is electrically connected to the first host and the second terminal 304 of the cable 300 is electrically connected to the second host, the logic controller 206 can enable one of the first control signal FCS and the second control signal SCS to make the switch circuit 240 utilize a two-stage transmission cascade structure of one of the first switch module 202 and the second switch module 204 to effectively prevent the first voltage VCONN1 from transmitting to the second host through the cable 300 or prevent the second voltage VCONN2 from transmitting to the first host through the cable 300.

The above mentioned operation timing shown in FIG. 3 is only an embodiment of the present invention. In other embodiments of the present invention, the switch circuit 240 is also suitable for other operation timings. In addition, operation timings of the switch circuits 200, 220 can be referred to the above mentioned description of the operation timing of the switch circuit 240, so further description thereof is omitted for simplicity.

In addition, the logic controller 206 can be a field programmable gate array (FPGA) with the above mentioned functions of the logic controller 206, or an application-specific integrated circuit (ASIC) with the above mentioned functions of the logic controller 206, or a software module with the above mentioned functions of the logic controller 206. In addition, the identification circuit 102 can be a field programmable gate array with the above mentioned functions of the identification circuit 102, or an application-specific integrated circuit with the above mentioned functions of the identification circuit 102, or a software module with the above mentioned functions of the identification circuit 102.

To sum up, when the first terminal of the cable receives the first voltage and the second terminal of the cable receives the second voltage, the switch circuit can utilize the logic controller to optionally make the first switch module transmit the first voltage to the identification circuit, or make the second switch module transmit the second voltage to the identification circuit. On the other hand, when the first terminal of the cable receives the first voltage, the second terminal of the cable receives the second voltage, the first switch module is turned off, and the second switch module is turned on, the first switch module can prevent the second voltage being transmitted to the first terminal of the cable, and the second switch module transmits the second voltage to the identification circuit. Therefore, compared to the prior art, the present invention can prevent a host of different hosts coupled to the switch circuit from being damaged by another host of the different hosts, can utilize the logic controller to optionally make a host of the different hosts provide a supply voltage to the identification circuit and prevent a supply voltage provided by another host of the different hosts from being transmitted to the identification circuit, and can provide a high enough supply voltage to the identification circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch circuit applied to a power delivery integrated circuit, wherein the power delivery integrated circuit is installed within a cable, the switch circuit comprising:
   a first switch module;
   a second switch module; and
   a logic controller, wherein when a first terminal of the cable receives a first voltage and a second terminal of the cable receives a second voltage, the logic controller makes one switch module of the first switch module and the second switch module conductive, and a turn-off voltage substantially the same as a larger voltage of the first voltage and the second voltage makes other switch module of the first switch module and the second switch module not conductive.

2. The switch circuit of claim 1, wherein the power delivery integrated circuit is installed within the first terminal of the cable or the second terminal of the cable, and a voltage received by a conductive switch module of the first switch module and the second switch module is transmitted to an identification circuit of the power delivery integrated circuit.

3. The switch circuit of claim 2, wherein when second terminal of the cable receives the second voltage, the logic controller makes the second switch module transmit the second voltage to the identification circuit, and the identification circuit transmits at least one of a maximum support transmission current, a maximum support transmission voltage, a serial number, a manufacturer, and a length of the cable to a second host after the identification circuit is turned on according to the second voltage, wherein the second host provides the second voltage.

4. The switch circuit of claim 2, wherein when the first terminal of the cable receives the first voltage, the logic controller makes the first switch module transmit the first voltage to the identification circuit, and the identification circuit transmits at least one of a maximum support transmission current, a maximum support transmission voltage, a serial number, a manufacturer, and a length of the cable to a first host after the identification circuit is turned on according to the first voltage, wherein the first host provides the first voltage.

5. The switch circuit of claim 2, wherein the first switch module comprises:
   a first transmission circuit, wherein a first terminal of the first transmission circuit is coupled to the first terminal of the cable;
   a second transmission circuit, wherein a first terminal of the second transmission circuit is coupled to a second terminal of the first transmission circuit, and a second terminal of the second transmission circuit is coupled to the identification circuit and a capacitor further comprised in the switch circuit;
   a first resistor, wherein a first terminal of the first resistor is coupled to the second terminal of the first transmission circuit and the first terminal of the second transmission circuit;
   a second resistor, wherein a first terminal of the second resistor is coupled to a second terminal of the first resistor;
   a first N-type metal-oxide-semiconductor transistor, wherein a first terminal of the first N-type metal-oxide-semiconductor transistor is coupled to a second terminal of the second resistor, and a second terminal of the first N-type metal-oxide-semiconductor transistor receives a bias; and a second N-type metal-oxide-semiconductor transistor, wherein a first terminal of the second N-type metal-oxide-semiconductor transistor is coupled to a third terminal of the first N-type metal-oxide-semiconductor transistor, a second terminal of the second N-type metal-oxide-semiconductor transistor receives a first control signal of the logic controller, and a third terminal of the second N-type metal-oxide-semiconductor transistor is coupled to ground.

6. The switch circuit of claim 2, wherein the second switch module comprises:

a third transmission circuit, wherein a first terminal of the third transmission circuit is coupled to the second terminal of the cable;

a fourth transmission circuit, wherein a first terminal of the fourth transmission circuit is coupled to a second terminal of the third transmission circuit, and a second terminal of the fourth transmission circuit is coupled to the identification circuit and a capacitor further comprised in the switch circuit;

a third resistor, wherein a first terminal of the third resistor is coupled to a second terminal of the third transmission circuit and the first terminal of the fourth transmission circuit;

a fourth resistor, wherein a first terminal of the fourth resistor is coupled to a second terminal of the third resistor;

a third N-type metal-oxide-semiconductor transistor, wherein a first terminal of the third N-type metal-oxide-semiconductor transistor is coupled to a second terminal of the fourth resistor, and a second terminal of the third N-type metal-oxide-semiconductor transistor receives a bias; and a fourth N-type metal-oxide-semiconductor transistor, wherein a first terminal of the fourth N-type metal-oxide-semiconductor transistor is coupled to a third terminal of the third N-type metal-oxide-semiconductor transistor, a second terminal of the fourth N-type metal-oxide-semiconductor transistor receives a second control signal of the logic controller, and a third terminal of the fourth N-type metal-oxide-semiconductor transistor is coupled to ground.

7. The switch circuit of claim 2, wherein when the first switch module is not conductive and the second switch module is conductive, the first switch module isolates the second voltage from being transmitted to the first terminal of the cable and the second switch module transmits the second voltage to the identification circuit, and when the second switch module is not conductive and the first switch module is conductive, the second switch module isolates the first voltage from being transmitted to the second terminal of the cable and the first switch module transmits the first voltage to the identification circuit.

8. The switch circuit of claim 2, wherein when the first terminal of the cable receives the first voltage and the second terminal of the cable does not receive the second voltage, the logic controller makes the first switch module transmit the first voltage to the identification circuit, and makes the second switch module not conductive.

9. The switch circuit of claim 2, wherein when the first terminal of the cable does not receive the first voltage and the second terminal of the cable receives the second voltage, the logic controller makes the second switch module transmit the second voltage to the identification circuit, and makes the first switch module not conductive.

10. A switch circuit applied to a power delivery integrated circuit, wherein the power delivery integrated circuit is installed within a cable, the switch circuit comprising:

a first switch module;

a second switch module; and a logic controller, wherein when a first terminal of the cable receives a first voltage, a second terminal of the cable receives a second voltage, an turn-off voltage substantially the same as a larger voltage of the first voltage and the second voltage makes the first switch module not conductive, resulting in the first switch module isolating the second voltage from being transmitted to the first terminal of the cable and isolating the first voltage from being transmitted to an identification circuit of the power delivery integrated circuit, and the second switch module transmits the second voltage to the identification circuit.

* * * * *